United States Patent
Hundemer et al.

(10) Patent No.: US 9,264,760 B1
(45) Date of Patent: Feb. 16, 2016

(54) SYSTEMS AND METHODS FOR ELECTRONICALLY TAGGING A VIDEO COMPONENT IN A VIDEO PACKAGE

(71) Applicant: Tribune Broadcasting Company, LLC, Chicago, IL (US)

(72) Inventors: Hank J. Hundemer, Bellevue, KY (US); Dana A. Lasher, Morgan Hill, CA (US)

(73) Assignee: Tribune Broadcasting Company, LLC, Chicago, IL (US)

( * ) Notice: Subject to any disclaimer, the term of this patent is extended or adjusted under 35 U.S.C. 154(b) by 0 days.

(21) Appl. No.: 13/629,497

(22) Filed: Sep. 27, 2012

Related U.S. Application Data

(60) Provisional application No. 61/542,077, filed on Sep. 30, 2011, provisional application No. 61/542,103, filed on Sep. 30, 2011.

(51) Int. Cl.
*H04N 21/435* (2011.01)

(52) U.S. Cl.
CPC .................................. *H04N 21/435* (2013.01)

(58) Field of Classification Search
USPC ....................................... 725/32, 42; 714/768
See application file for complete search history.

(56) References Cited

U.S. PATENT DOCUMENTS

| | | | |
|---|---|---|---|
| 6,195,458 B1 | 2/2001 | Warnick et al. | |
| 6,606,409 B2 | 8/2003 | Warnick et al. | |
| 6,721,361 B1 | 4/2004 | Covell et al. | |
| 6,724,933 B1 | 4/2004 | Lin et al. | |
| 6,778,224 B2 | 8/2004 | Dagtas et al. | |
| 8,433,108 B2 | 4/2013 | Bateman | |
| 8,761,452 B2 | 6/2014 | Bateman | |
| 2002/0083439 A1* | 6/2002 | Eldering | G06Q 30/02 725/32 |
| 2004/0153948 A1* | 8/2004 | Kato | G11B 20/10 714/768 |
| 2006/0026628 A1 | 2/2006 | Wan et al. | |
| 2009/0249386 A1 | 10/2009 | Shan et al. | |

\* cited by examiner

*Primary Examiner* — Jefferey Harold
*Assistant Examiner* — Sihar Karwan
(74) *Attorney, Agent, or Firm* — McDonnell Boehnen Hulbert & Berghoff LLP

(57) ABSTRACT

Disclosed herein are systems and methods for electronically tagging a video component (VC) in a video package. One example method includes the steps of: (i) receiving a video package; (ii) identifying a position of each of multiple video sections (VS) in the received video package; (iii) identifying a type of at least a portion of the VSs having identified positions, wherein at least one VS is identified as having a show-segment VC type; (iv) determining a total duration of the VSs identified as having a show-segment VC type; (v) determining a total count of the VSs identified as having a show-segment VC type; (vi) responsive to determining that the determined total duration is within a threshold range of a predetermined duration, associating tagging data with the received video package, wherein the tagging data indicates the position and type of each VS identified as having a show-segment VC type.

28 Claims, 9 Drawing Sheets

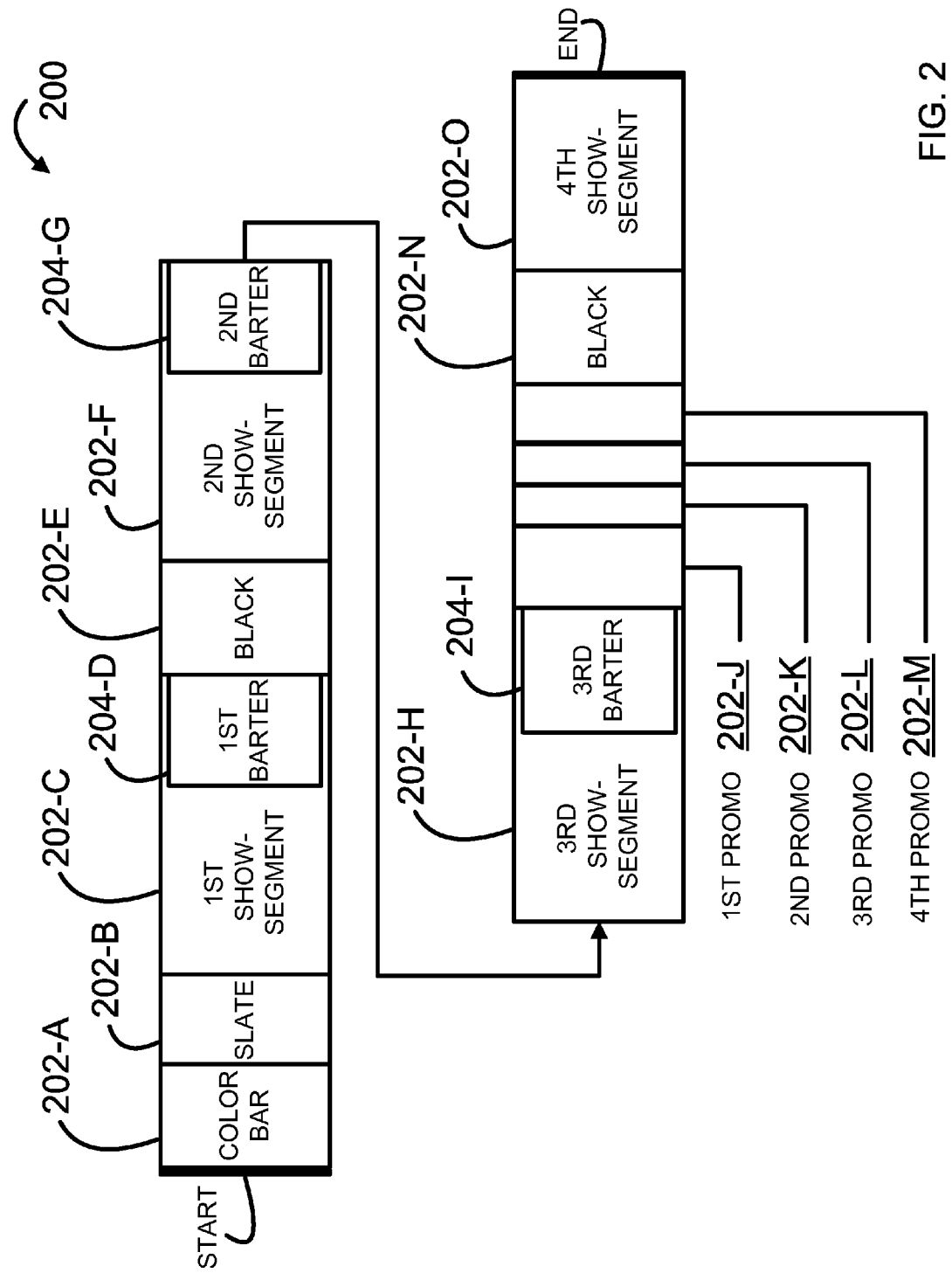

SYSTEMS AND METHODS FOR ELECTRONICALLY TAGGING A VIDEO COMPONENT IN A VIDEO PACKAGE

CROSS REFERENCE TO RELATED APPLICATIONS

This application claims priority to U.S. Provisional Patent Application Ser. No. 61/542,077, entitled "System and Method for Automated Video Content Tagging," filed on Sep. 30, 2011 and U.S. Provisional Patent Application Ser. No. 61/542,103, entitled "System and Method for a Master Controller," filed on Sep. 30, 2011, both of which are hereby incorporated by reference herein in their entirety.

This application also relates to U.S. patent application Ser. No. 13/629,405, entitled "Systems and Methods for Identifying a Black/Non-Black Frame Attribute," U.S. patent application Ser. No. 13/629,481 entitled "Systems and Methods for Identifying a Colorbar/Non-Colorbar Frame Attribute," U.S. patent application Ser. No. 13/629,495, entitled "Systems and Methods for Identifying a Video Aspect-Ratio Frame Attribute," U.S. patent application Ser. No. 13/629,446, entitled "Systems and Methods for Identifying a Scene-Change/Non-Scene-Change Transition Between Frames," and U.S. patent application Ser. No. 13/629,430, entitled "Systems and Methods for Identifying a Mute/Sound Frame Attribute," all of which are commonly assigned to the assignee of the present application, are being filed simultaneously, and are hereby incorporated by reference herein in their entirety.

USAGE AND TERMINOLOGY

Throughout this application, with respect to all reasonable derivatives of such terms, and unless otherwise specified (and/or unless the particular context clearly dictates otherwise), each usage of:

"a" or "an" is meant to read as "at least one."

"the" is meant to be read as "the at least one."

the term "video" refers broadly to any material represented in a video format (i.e., having a plurality of frames). In some instances, video may include a plurality of sequential frames that are identical or nearly identical, and that may give the impression of a "still" image. Video may also include frames that merely show a black screen, colorbars, testing data, or other traditionally non-substantive content. It should be noted that while non-substantive content may have little or no utility to a typical viewer, it provides useful information for the purpose of the techniques described throughout this disclosure. Video may or may not include an audio portion.

the term "video component" (VC) refers to video that one of ordinary skill in the art would typically consider to be self-contained, and that is typically separately scheduled by a scheduling-and-sequencing system (also commonly referred to as a traffic system) in a broadcasting environment. There are several types of VCs, including for example a show-segment VC, a barter VC, and a promotion VC. A show-segment VC consists of at least a portion of a show, and potentially one or more commercials, all of which are grouped together and considered as one unit for the purpose of scheduling-and-sequencing. A show may be, for example, an episode of a sitcom, a news program, or a movie. A barter VC consists of one or more commercials, all of which are grouped together and considered as one unit for the purpose of scheduling-and-sequencing. A barter VC is a subset of a show-segment VC, namely the portion including the one or more commercials. A promotion VC consists of a promotion or advertisement (e.g., for an associated show).

the term "video package" refers to a collection of VCs and other video, all of which has a logical or other relationship or association. Typically, the video package includes a plurality of sequentially ordered VCs that may or may not be separated by other video (e.g., black frames), and the video package may have the appearance of being a single, continuous piece of video when analyzed using traditional methods. Each video package includes at least one, and often a group of show-segment VCs that are intended to be aired during a corresponding thirty-minute, one-hour, two-hour, or other predefined time slot. Though not required, a video package is often created by a show syndicator and provided to a broadcaster.

TECHNICAL FIELD

The presently disclosed systems and methods relate to video analysis, and more particularly, to electronically tagging a VC in a video package within a television-broadcasting environment.

BACKGROUND

In the field of television broadcasting, video packages containing one or more VCs are typically created by a third party (e.g., a show syndicator) and then delivered to a broadcaster for commercial broadcast. A common video package is one that is associated with an episode of a show series, where the episode is intended to be aired during a thirty-minute timeslot. Such a video package may include multiple VCs, including for example (i) multiple show-segment VCs, each of which consists of a different portion of the episode and potentially one or more commercials, and (ii) multiple promotion VCs, each of which consist of a promotion for the episode.

Generally, VCs in a video package are arranged in the order in which they are intended for broadcast, and they may or may not be separated by other video (e.g., black frames). Therefore, a user (usually associated with the broadcasting company) is tasked with the project of "tagging" the VCs in the video package, which involves the user visually analyzing the video package and identifying one or more VCs contained therein. Identifying a VC in this manner involves the user identifying both a position of the VC (e.g., with starting and ending frame indicators) and a type of the VC (e.g., a show-segment VC). The user may then store or otherwise associate the identifying information with the corresponding video package. Among other things, tagging a VC in this manner facilitates the scheduling and broadcasting of the VC at the appropriate time (e.g., via a scheduling-and-sequencing system and a playout system in a broadcasting environment).

In some instances, VCs in the video package may be positioned out of the intended broadcast order. For example, a promotion VC in a video package is often positioned after a show-segment VC in the video package, even though the promotion VC is intended to be broadcast first (i.e., to advertise for the show). As such, by tagging the promotion VC, it may be scheduled and broadcast at the appropriate time.

In television-broadcasting environments, a show syndicator often provides information about a video package, such as approximate starting and ending durations of VCs in the video package. Traditionally, video packages were stored on analog storage mediums (e.g., tapes) that lacked random access (i.e., direct access to a particular location), and therefore information like the approximate starting position of a VC allowed a user to fast-forward the tape to the identified approximate position to aid in the tagging process. Despite the recent movement towards random-access storage-mediums (including, for example, hard-disk drives), for a variety of reasons, show syndicators continue to provide such information with video packages. This provided information is often referred to in the industry as daily timing-sheet data (DTD).

While DTD may be available to the broadcaster, select portions of the DTD, particularly the starting and ending positions of the VCs, are often not exact, and therefore, a user is still needed to perform the tagging process. In addition to accuracy concerns, DTD is typically not presented in a manner that allows for efficient processing and use in the tagging process. For example, it is often contained in a handwritten document that is faxed to the broadcaster along with the video package. Further, even when the DTD is presented in electronic form (e.g., as a typed document), show syndicators do not share a common protocol, but instead each present the DTD in their own format making efficient use of it difficult. For at least the reasons stated above, the traditional tagging process requires a considerable amount of time and resources. Indeed, tagging all of the VCs in a typical video package associated with a show intended for a thirty-minute time-slot, typically takes between ten to fifteen minutes. Given the large number of television shows that are broadcast on a regular basis across multiple networks, a substantial amount of time and resources are devoted to this tagging process.

The traditional tagging process also commonly results in an undesired amount of black frames being broadcast. During the tagging process, a user typically selects a position (e.g., with a mouse click via a graphical user-interface (GUI)) within the video package to designate a starting or ending position of a VC. However, in many instances, the user's selected frame is one or more frames displaced from the actual starting or ending frame of the VC. This often results in undesired black frames being added to the beginning or end of the VC when it is broadcast. Broadcasting these undesired black frames may diminish the experience of the viewer and/or may reduce the amount of time in which a broadcasting company may broadcast VCs.

SUMMARY

Disclosed herein are systems and methods for electronically tagging a VC in a video package that improve upon traditional tagging approaches such as the one described in the background section above.

One example advantage of the presently disclosed systems and methods is the ability to efficiently and accurately tag a VC in a video package.

Another example advantage of the presently disclosed systems and methods is the ability to tag a VC in a video package while reducing or eliminating user interaction.

Another example advantage of the presently disclosed systems and methods is the ability to add video packages having certain characteristics to a work queue for user review.

Another example advantage of the presently disclosed systems and methods is the ability to reduce or eliminate undesired black frames at the beginning and/or end of a VC in a video package, thereby improving viewer experience and/or creating an opportunity to broadcast additional video in a given time-slot.

Various embodiments of the presently disclosed systems and methods may have none, some, or all of these advantages. Other advantages will be described throughout this disclosure and/or will be readily apparent to one of ordinary skill in the art.

A first example embodiment takes the form of a method that includes the steps of: (i) receiving, by a frame-processing device, a video package; (ii) identifying, by a starting frame indicator and an ending frame indicator, a position of each of multiple video sections (VS) in the received video package based on frame-pair transitions in the received video package; (iii) identifying a type of at least a portion of the VSs having identified positions, wherein at least one VS is identified as having a show-segment VC type; (iv) determining a total duration of the VSs identified as having a show-segment VC type; (v) determining a total count of the VSs identified as having a show-segment VC type; (vi) determining whether each condition in a condition set is satisfied, the condition set including the determined total duration is within a threshold range of a predetermined duration; and (vii) responsive to determining that each condition in the condition set is satisfied, associating tagging data with the video package, wherein the tagging data indicates the position and type of each VS identified as having a show-segment VC type.

A second example embodiment takes the form of a non-transitory computer-readable medium containing instructions that, when executed by a processor, cause a set of steps to be carried out by a frame-processing device. The set of steps include those steps recited in the preceding paragraph.

A third example embodiment takes the form of a frame-processing device that includes a processor and the non-transitory computer-readable medium described in the preceding paragraph.

BRIEF DESCRIPTION OF THE DRAWINGS

For a more complete understanding of the presently disclosed systems and methods, reference is now made to the following descriptions, taken in conjunction with the accompanying drawings, in which:

FIG. 2 is a graphical representation of video sections in an example video package in accordance with at least one embodiment.

DETAILED DESCRIPTION OF THE DRAWINGS

The detailed description of the drawings includes sections related to (I) an example system including a frame-processing device, (II) types of video sections, (III) an example video package, (IV) format-sheet data, (V) broadcaster data, (VI) an example method for electronically tagging a VC in a video package, (VII) example advantages, and (VIII) example variations.

I. Example System Including a Frame-Processing Device

Figure 1:
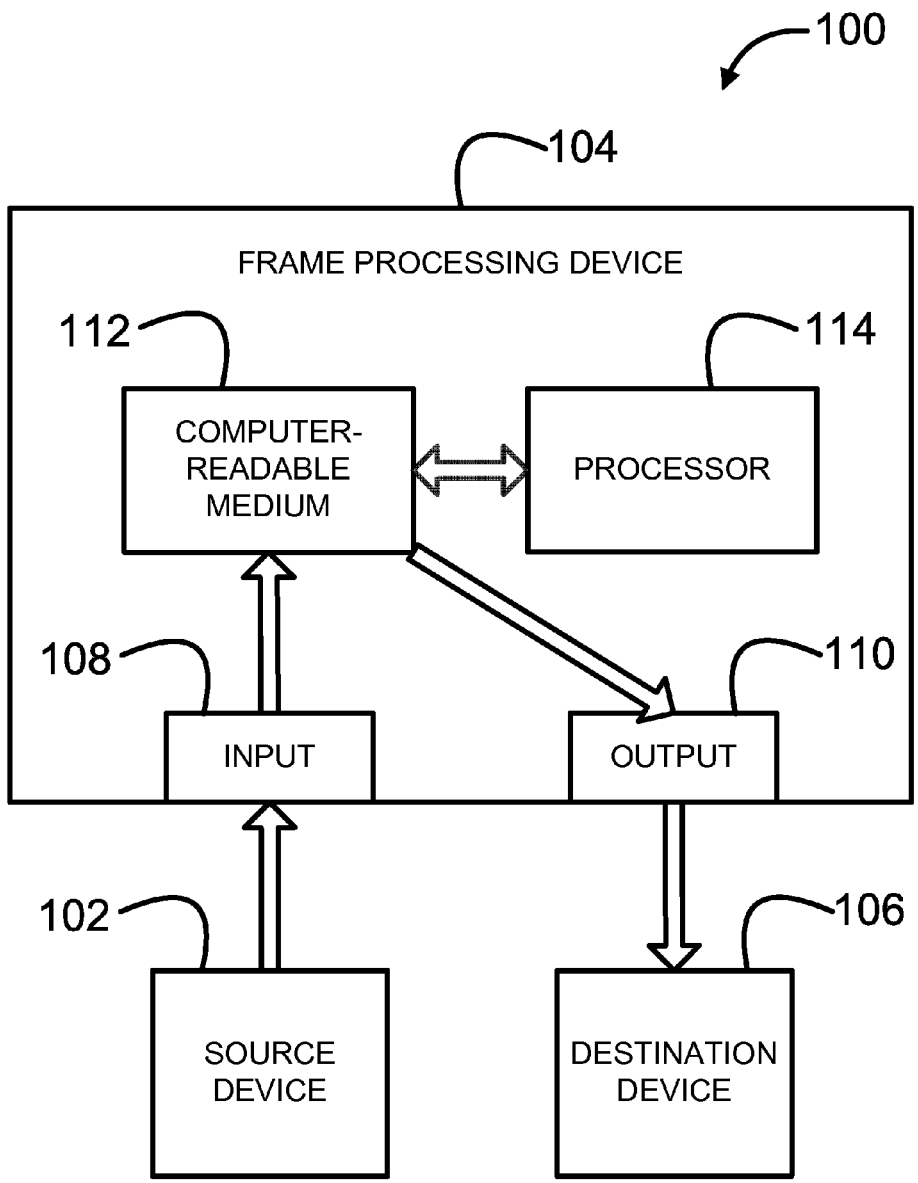
FIG. 1 is an example system in accordance with at least one embodiment.

Turning now to FIG. 1, an example system is provided and is generally designated 100. Included in the system 100 is a source device 102, a frame-processing device 104, and a destination device 106. Example source devices 102 include satellite receivers, decoders, baseband fiber transcoders, DVD players, Internet-delivery-based playout devices (e.g., Pathfire devices provided by DG FastChannel, Inc. of Irving Tex.), and other frame-processing devices. The frame-processing device 104 includes a video input connection 108 and is configured for receiving video via the video input connection from the source device 102. In one embodiment, the frame-processing device 104 is configured for receiving raw baseband video based on the HD-SDI standard with a data transfer rate in the range of 1.4 Gbps-1.6 Gbps (and typically approximately 1.485 Gbps). Throughout this application, unless otherwise stated, all disclosed ranges are inclusive of the stated bound values. It is contemplated that the frame-processing device 104 is optionally configured for receiving video based on other standards, including but not limited to those defined by the Society of Motion Picture and Television Engineers ("SMPTE") as well as those of the Advanced Television System Committee ("ATSC").

A video output connection 110 on the frame-processing device 104 is configured for sending video to a destination device 106 (e.g., for playout of the video, and that may include the example source devices provided above). Further, the frame-processing device 104 includes a non-transitory computer-readable medium 112 and a processor 114. In the frame-processing device 104, the video input connection 108, the video output connection 110, the computer-readable medium 112, and the processor 114 may all be directly or indirectly electronically connected with one another. In the system 100, the frame-processing device 104, the source device 102, and the destination device 106, are all directly or indirectly electronically connected (preferably via the video input connection 108 and the video output connection 110). The computer-readable medium 112 contains instructions that, when executed by the processor 114, cause a set of steps to be carried out for electronically tagging a VC in a video package.

II. Types of Video Sections

In one aspect of the presently disclosed systems and methods, a video package may be divided into multiple video sections (VS) based on properties of the video package. Each VS may be one of several types, examples of which are described below.

A first type is a colorbar VS, which consists of frames displaying an arrangement of colored bars. These bars may be commonly referred to as SMPTE colorbars and are typically used as a type of television test pattern. Typically, a video package includes at most one colorbar VS, and it is typically positioned as the first few VSs in the video package. Numeric and relational modifiers such as "first," "second," and "last" as used in connection with VSs, VCs, frames, attributes, and transitions throughout this disclosure are intended to designate a sequential position, except in instances where types or conditions are being enumerated (e.g., as provided at the start of this paragraph).

A second type is a slate VS, which consists of substantially similar or identical frames with content that identifies the associated video package. For example, the content in a slate VS section may show the title and/or producer of a show associated with the video package. Typically, a video package has one slate VS, and it is typically positioned as the second VS in the video package. In some instances, a video package may have two adjacent slate VSs. If the video package does not include a colorbar VS, typically the slate VS is positioned as the first VS section in the video package. In some instances, a slate VS may also refer to a slate/colorbar hybrid VS, where an upper portion of the corresponding frames include typical slate information, and where the lower portion of the corresponding frames show colorbars as described above.

A third type is a black VS, which consists of black frames. For example, a black VS may have a generally short duration (e.g., two seconds) and may separate two commercials in a show-segment VC. Alternatively, a black VC may be a "local-black" placeholder positioned in between two show-segment VCs that indicates where the broadcasting company should insert local-commercials for broadcast.

A VS may also be a VC. As such, a fourth type of VS is a show-segment VC. A show-segment VC consists of at least a portion of a show, and potentially one or more commercials (typically provided by a show syndicator). Typically, a show is divided into multiple show-segment VCs depending on its total duration, with each being spaced apart within the video package. For example, a show intended to fill a portion of a thirty-minute time-slot may include four show-segment VCs, with each being approximately five and a half minutes in duration (for a total of twenty-two minutes). Notably, the combined duration of all show-segment VCs is still less than the thirty-minute time-slot since some time is provided for other video (e.g., local commercials). Show-segment VCs are typically spaced throughout the video package. In some instances, a show-segment VC may be further identified as a first show-segment VC or a remaining (i.e., a second, third, etc.) show-segment VC.

A fifth type of VS is a barter VC, which is a portion of a show-segment VC, namely the portion including the one or more commercials. Most show-segment VCs include a barter VC. However, there is one common exception, namely the last show-segment VC in the video package typically does not include a barter VC (as it typically includes only a last portion of the show). Notably, while broadcasting a show-segment VC would by definition broadcast the included barter VC, in some instances, a barter VC is broadcast separately (e.g., if breaking news prevented the barter VC from being broadcast during its originally scheduled time), and therefore a barter VC is identified as a separate VC such that it may be separately scheduled. Barter VCs typically have a duration that is approximately a multiple of fifteen seconds to correspond with the duration of traditional television commercials. These durations may be referred to herein as "common barter durations."

A fifth type of VS is a promotion VC. A promotion VC consists of a promotion or advertisement for a show (typically the show associated show the same video package including the promotion VC). Promotion VCs typically have a duration that is approximately a multiple of five seconds to correspond with the duration of traditional television promotions. These durations may be referred to herein as "common promotion durations."

III. Example Video Package

Turning now to FIG. 2, an example video package 200 having a plurality of VSs 202 is shown. For clarity, the video package 200 is shown in two parts, however it should be interpreted as a single video package.

In the video package 200, a colorbar VS 202-A is followed by a slate VS 202-B, a first show-segment VC 202-C (which includes a first barter VC 204-D), a black VS 202-E, a second show-segment VC 202-F (which includes a second barter VC 204-G). Further in the sequence is a third show-segment VC 202-H (which includes a third barter VC 204-I), a first promotion VC 202-J, a second promotion VC 202-K, a third promotion VC 202-L, a fourth promotion VC 202-M, a black VS 202-N, and finally a fourth show-segment VC 202-O.

The video package 200 may contain additional VSs. For example, a black VS with a generally short duration (e.g., two seconds) may separate the slate VS 202-B and the first show-segment VC 202-C. For clarity, these are not shown in FIG. 2, but they are discussed in connection with the example methods below. Also, the VSs in FIG. 2 are not necessarily drawn to scale with respect to their duration.

IV. Format-Sheet Data

Despite the depiction provided in FIG. 2, the identity (i.e., the type and position) of each VS 202 is typically not known when the video package 200 is received from the show syndicator. However, when a broadcasting company agrees to broadcast a series of shows provided by a show syndicator, the parties typically agree on certain information about the format and timing metrics that shall apply to all shows in the series. This information is commonly recorded on a format-sheet accompanying an agreement between the parties (or otherwise recorded), and is commonly referred to in the industry as "format-sheet data" (FSD). As shown below, specific FSD is referred to throughout this disclosure with the prefix "FSD-."

The FSD typically includes the total number of show-segment VCs contained in the video package (referred to herein as the "FSD-NumShowSegVCs" value). For the example video package 200, the FSD-NumShowSegVCs value should be four (since there are four show-segment VCs 202-C, 202-F, 202-H, and 202-O).

The FSD also typically includes the combined duration of all show-segment VCs contained in the video package (referred to herein as the "FSD-DurShowSegVCs" value). For illustration purposes, assume that in the example video package 200, the three show-segment VCs 202-C, 202-F, and 202-H each have durations of six minutes, and the fourth show-segment VC 202-O has a duration of four minutes. In this case, the FSD-DurShowSegVCs value should be twenty-two minutes (or within a threshold duration thereof).

V. Broadcaster Data

In addition to the FSD, additional values may be set (e.g., by the broadcaster) and considered in connection with the FSD to carry out the steps of the presently disclosed methods. This additional data will be referred to herein as broadcaster data (BD), and identified with the prefix "BD-." BD is often set based on empirical data.

The BD may include, for example, a minimum black-transition duration (referred to herein as the "BD-MinBlackTransDur" value), which indicates the shortest duration of contiguous black frames (i.e., having black frame-attributes as discussed below) that may be considered significant for the purposes of dividing a portion of the video package into two VSs. In one embodiment, the BD-MinBlackTransDur value is in a range from zero seconds to four seconds, and in a more particular embodiment, is approximately one and three tenths seconds.

The BD data may also include a minimum show-segment VC duration (referred to herein as the "BD-MinShowSegVC-Dur" value), which indicates the shortest duration that a show-segment VC may have. In one embodiment, the BD-MinShowSegVCDur value is in a range from three minutes to five minutes, and in a more particular embodiment, is approximately four minutes.

The BD may also include a time-slot duration (referred to herein as the "BD-TimeSlotDur" value), which indicates the duration of the time-slot in which the show-segment VCs in a video package are intended to be broadcast. The BD-TimeSlotDur value is typically a multiple of fifteen minutes to correspond with traditional television time-slots.

The BD may also include a maximum barter-duration (referred to herein as the "BD-MaxBarterDur" value), which indicates the maximum duration that a barter VC may have. In one embodiment, the BD-MaxBarterDur value is in a range from one minute to two minutes, and in a more particular embodiment, is approximately one minute.

Similar to the FSD, the BD is typically applicable across all shows in a show series. As such, like the FSD, the BD typically only needs to be set for one show series.

In one embodiment, the FSD and the BD for a corresponding show series are maintained in a table (or other data structure), and may be entered and/or modified by a user. Based on an indication of a show series for a particular video package, appropriate FSD and BD for that video package may be obtained from the table. By considering this data together with certain frame attributes, and by applying a set of tests/rules, the presently disclosed methods provide for the ability to efficiently and accurately tag a VC in a video package.

VI. Example Method for Electronically Tagging a VC in a Video Package

Figure 3A:
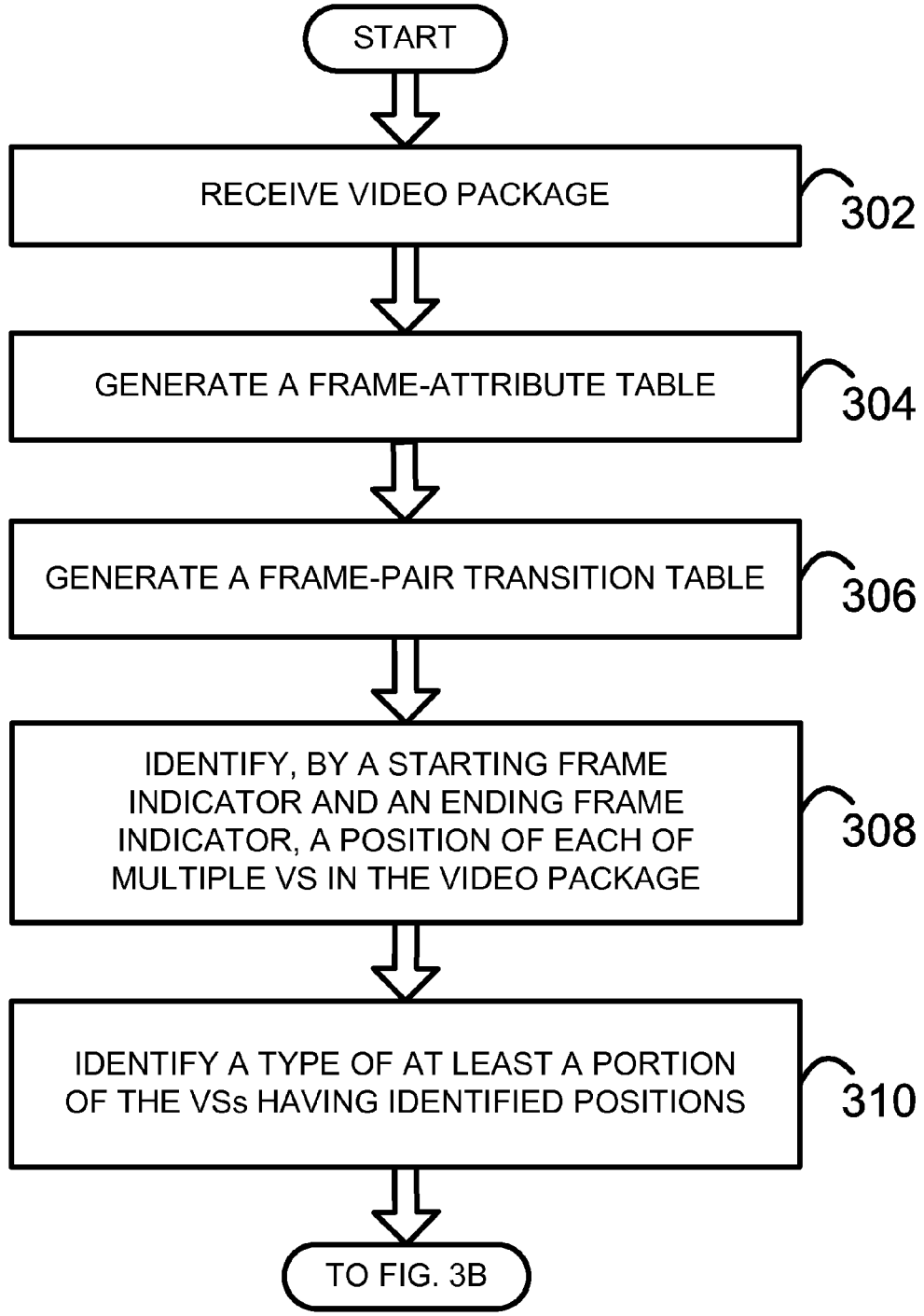
FIG. 3 (3A, 3B, and 3C) is a flow chart illustrating steps of an example method in accordance with at least one embodiment.
Figure 3B:
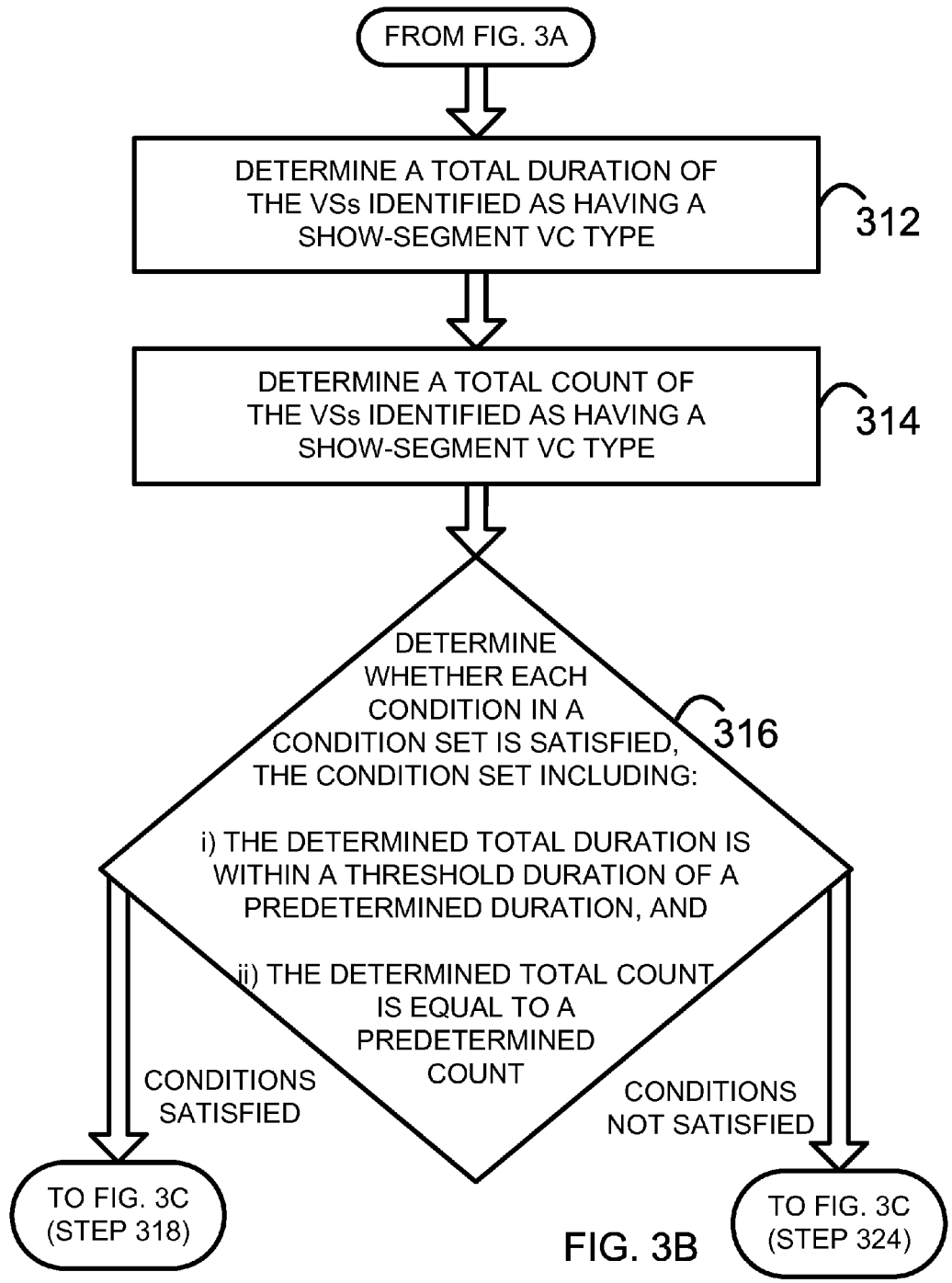
Figure 3C:
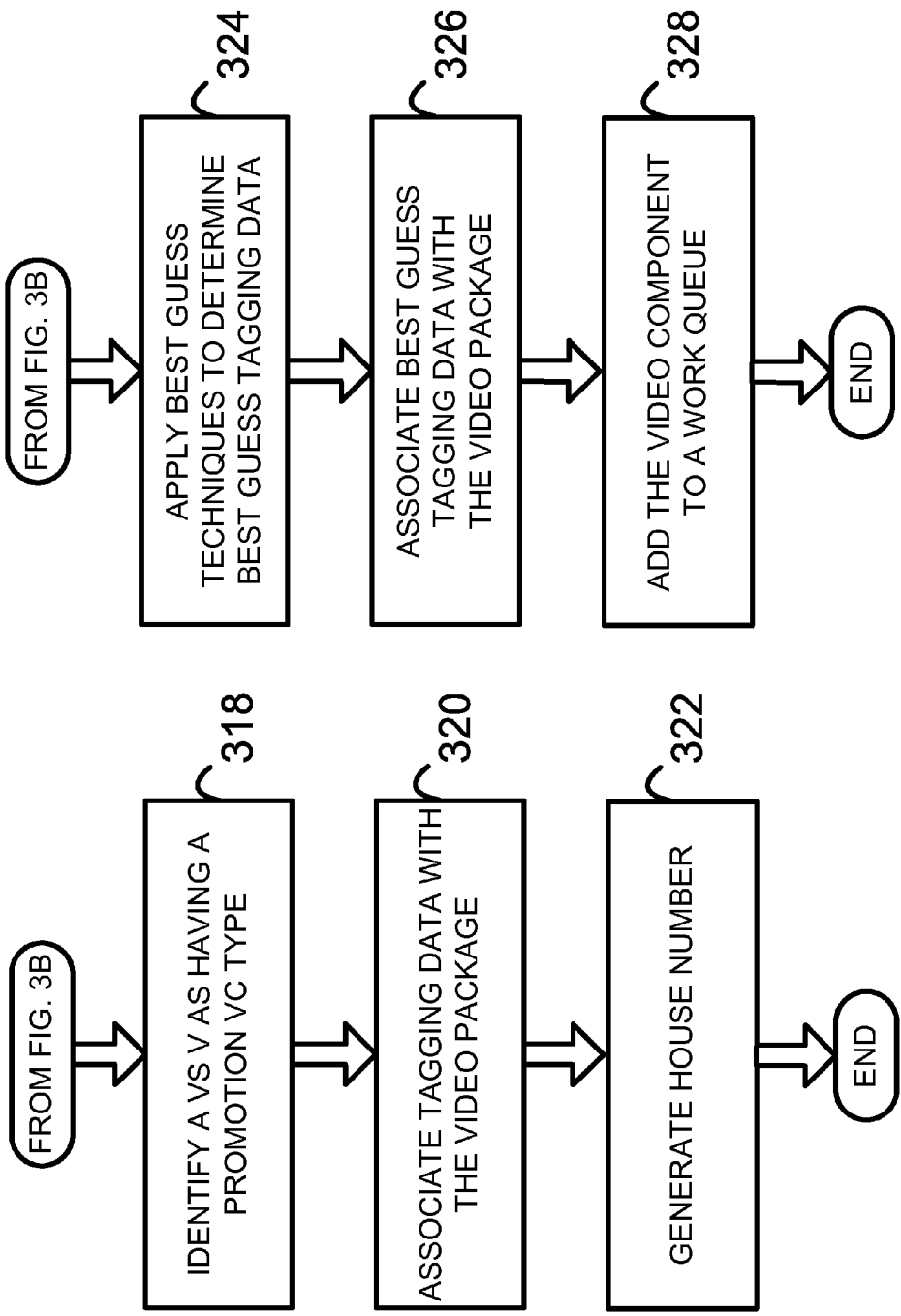

Turning now to FIG. 3 (FIGS. 3A-3C), a flow chart illustrating steps of an example method in accordance with at least one embodiment is shown. It is noted that the described steps throughout this application need not be performed in the disclosed order, although in some embodiments, the recited order of steps may be preferred. Also, not all steps need to be performed to achieve the desired goals of the presently disclosed methods, and therefore not all steps are required. Further, some of the conditions used in the presently disclosed methods were determined based on extensive testing and empirical data. Therefore, in some instances, the underlying reasoning for the use of select conditions may be limited.

The description of the example methods includes sections related to (A) generating frame-attribute and frame-pair transition tables for a video package, (B) identifying, by a starting frame indicator and an ending frame indicator, a position of each of multiple VSs in the received video package, (C) identifying a type of at least a portion of the VS having identified positions, (D) testing the identified positions and types of the VSs in the video package, (E) identifying promotion VCs in the video package, (F) associating tagging data with the video package, (G) generating a house number based on the tagging data, and (H) adding the video package to a work queue.

A. Generating Frame-Attribute and Frame-Pair Transition Tables for a Video Package In step 302, the frame-processing device 104 receives a video package (e.g., via the video input connection 108). In step 304, the frame-processing device generates a frame-attribute table (or other data structure) that represents select attributes of all (or at least multiple) frames in the received video package. In one embodiment, the frame attributes include (i) a black/non-black attribute, (ii) a colorbar/non-colorbar attribute, (iii) a video aspect-ratio attribute, (iv) a mute/sound attribute, and (v) a mono/multi-channel attribute. In one embodiment, indications representing these attributes are set according to the systems and methods disclosed in one or more of the cross-referenced applications. However it is contemplated that other techniques may be used.

A black/non-black frame attribute generally indicates whether a frame is black. A frame that is generally black but that includes some insignificant non-black content (e.g., resulting from static or noise) is generally still considered to be black.

A colorbar/non-colorbar frame attribute generally indicates whether a given frame displays a static arrangement of colored bars. As discussed above, these bars may commonly be referred to as SMPTE colorbars and are typically used as a type of television test pattern.

A video aspect-ratio generally indicates one of multiple potential aspect-ratios of the content in a given frame. In some instances, the attribute may indicate a specific aspect-ratio (e.g., 4:3 or 16:9). In other instances, the attribute may indicate a category of aspect-ratios (e.g., standard, non-standard, or widescreen).

A mute/sound attribute generally indicates whether an audio sample-set associated with a given frame has a sufficiently low level of loudness such that it may logically to be considered to be "mute," or whether the sample set has a sufficiently high level of loudness such that it may logically be considered to have "sound." Like the black/non-black attribute, even when a sample set has an insignificant level of loudness (e.g., due to static or noise), it is still generally considered to be "mute."

A mono/multichannel attribute generally indicates whether an audio sample set associated with a frame was originally recorded with a mono or a multichannel (e.g., stereo) organization of audio.

Notably, while the mute/sound and mono/multichannel attributes are based on an audio sample-set (rather than on the content of a frame), reference may be made to a frame's mute/sound or mono/multichannel attribute throughout this disclosure since a frame may (and often does) correspond to an audio sample-set (e.g., based on the HD-SDI standard).

Returning again to step 304, in one embodiment, the frame-processing device 104 generates the frame-attribute table in real-time or near real-time by analyzing each frame and adding appropriate data to the frame-attribute table as that frame is received via the video input connection 108. Such a configuration provides for generating the frame-attribute table while contemporaneously processing each frame of baseband video to create an encoded file representing the video. In another embodiment, video may also be obtained by decompressing and/or decoding an encoded file such as may be stored on the computer-readable medium 112, or stored on the source device 102, and then the frame-attribute table may be generated.

When processing frames in real-time or near real-time (e.g., through use of a frame buffer), there is an inherent limitation in that the analysis corresponding to that frame must be performed during an execution time period that is less than a reciprocal of the frame rate of the video (e.g., the analysis for each of the above-identified attributes must collectively be performed within 1/29.97 seconds for video having a frame rate of 29.97 frames per second).

Such time constraints present considerable challenges, particularly when the video is being transferred at a high data rate, as the amount of data and the complexity of the calculations carried out by the processor 114 increase. However, due at least in part to the various optimization techniques described throughout this disclosure and the cross-referenced applications, the analysis can be performed within limited time constraints and/or with a reduced use of system resources.

As one example of the efficiency of the frame-processing device 104 generating the frame-attribute table, testing shows that a portion of the frame-attribute table (i.e. with respect to a current frame) is capable of being built contemporaneously while processing the current frame for video based on the HD-SDI standard (i.e., having a transfer rate of approximately 1.485 Gbps and a frame rate of 29.97 frames per second) using a quad-core processor, with each core having a speed of 2 GHz (e.g., a Xeon E5405 processor provided by Intel® of Santa Clara, Calif.).

Returning again to FIG. 3, in step 306, the frame-processing device 104 generates a frame-pair transition table (or other data structure) that represents select transitions for all (or at least multiple) pairs of adjacent frames in the video package. In one embodiment, select transitions between frames correspond to the attributes in the frame-attribute table and may be identified as: (i) to-black, (ii) from-black, (iii) to-colorbar, (iv) from-colorbar, (v) to-standard-aspect-ratio, (vi) from-standard-aspect-ratio, (vii) to-mute, (viii) from-mute, (ix) to-mono, and (x) from-mono transitions. It should be understood that alternative transition identifiers may be used to represent the same transition. For example, a from-non-black transition identifier may logically refer to the same transition as a to-black transition identifier.

The above-described portion of the frame-pair transition table is derived from the frame-attribute table. For example, if a frame n has a black attribute and a frame n+1 has a non-black attribute, a transition identifier between frames n and n+1 would indicate a from-black (or perhaps a to-non-black) transition. Likewise, if the frame n has a non-colorbar attribute and the frame n+1 has a colorbar attribute, another transition identifier between frames n and n+1 would indicate a to-colorbar (or perhaps a from-non-colorbar) transition.

In one embodiment, additional transitions may be identified as (xi) scene-change and (xii) non-scene-change transitions. A scene-change transition refers to a pair of adjacent frames that are contained in different recordings or "cuts." For example, consider video showing two individuals in an interview, but that toggles back and forth between recordings from two cameras (e.g., with each camera facing a different individual). In this video, each toggle represents a scene-change transition. Scene-change transitions may also result from the change between frames having select attributes (e.g., from black to colorbar).

Scene-change transitions differ from those identified above in that the former are not determined by comparing attributes as represented in the frame-attribute table, but instead are determined based on a direct analysis of frames in a frame pair. In one embodiment, scene-change transitions are identified according to the systems and methods disclosed in cross-referenced U.S. patent application Ser. No. 13/629, 446. However it is contemplated that other techniques may be used.

B. Identifying, by a Starting Frame Indicator and an Ending Frame Indicator, a Position of Each of Multiple VSs in the Received Video Package Referring again to FIG. 3, in step 308, the frame-processing device 104 identifies, by a starting frame indicator and an ending frame indicator, a position of each of multiple VSs in the received video package based on frame-pair transitions in the video package. In one embodiment, the frame-processing device 104 identifies these starting and ending frame indicators based on indications in the generated frame-attribute table and/or the generated frame-pair transition table, such as by performing the sub-steps 308-1 through 308-3 described below.

Figure 4:
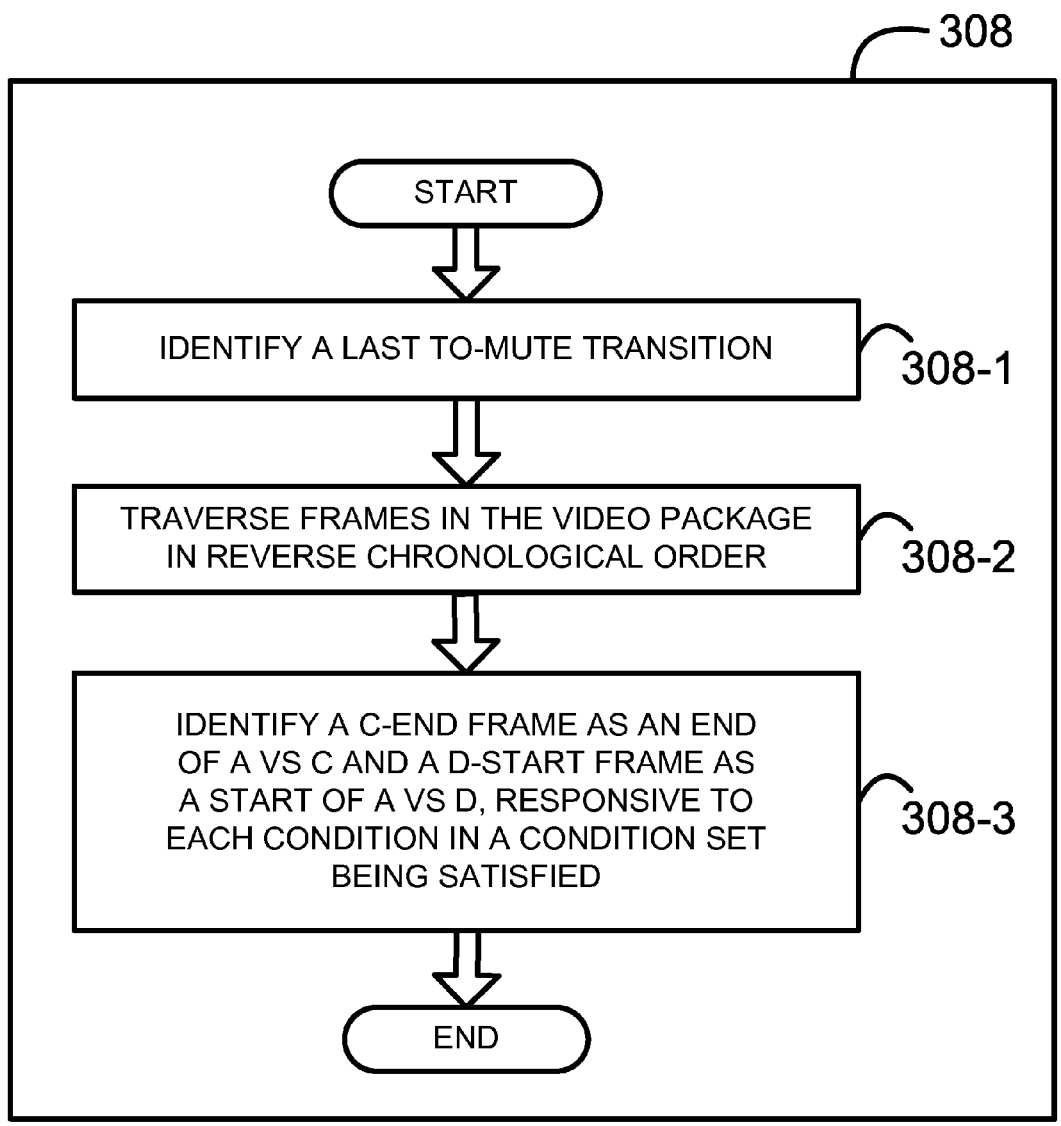
FIG. 4 is a flow chart illustrating sub-steps of step 308 in FIG. 3

Referring now to FIG. 4, in step 308-1, the frame-processing device 104 identifies a last to-mute transition in the video package (e.g., based on an indicator in the frame-transition table). For illustration purposes, the two frames on which the last to-mute transition is based are referred to in sequence as frame A and frame B. Notably, a reasonable conclusion is that the frame A is the last frame of potential interest for the purposes of the presently disclosed methods as it is the last frame in the video package to have sound. In alternate embodiments, in step 308-1, the frame-processing device 104 may identify a last to-black transition in the video package (also resulting in a frame A and frame B). Similarly, in this instance, a reasonable conclusion is that the frame A is the last frame of potential interest for the purposes of the presently disclosed methods as it is the last non-black frame in the video package.

In step 308-2, the frame-processing device 104 traverses frames of the video package in reverse chronological order starting with the frame A. To avoid confusion in this disclosure, despite the discussion of a reverse chronological traversal of frames, relational terms such as "first," "second," "previous" and "next" are used with respect to the standard chronological order of frames in a video package. As such, the description may refer to a frame X as being previous to a frame Y (which likewise means that the next frame after the frame X is the frame Y). As such, in a reverse chronological traversal, the order of traversal would be the frame Y and then the frame X. Further, note that use of the frame identifiers (e.g., X and Y) are arbitrary and should not be considered to be indicative of any order. These comments referring to relational terms in view of the standard chronological order are also applicable to VSs and VCs.

In step 308-3, during the traversal, the frame-processing device 104 identifies a C-end frame as an end of a VS C and an adjacent D-start frame as a start of a VS D, responsive to each condition in a condition set being satisfied.

A first condition in the condition set is that the C-end frame and the D-start frame have either a from-black or a to-black transition (e.g., based on an indicator in the frame-transition table). A second condition is that a duration of contiguous black-frames starting at the transition is more than a first threshold-black-duration, which in one embodiment is a value in a range from zero seconds to one second, and in a more particular embodiment, is approximately one-sixth second. Notably, any duration disclosed herein may also be represented as a number of frames based on the frame-rate.

The contiguous black-frames as referenced above differ depending on whether the transition is a to-black or a from-black transition. To illustrate, if the C-end frame and the D-start frame have a to-black transition, the contiguous black-frames are those frames starting with the D-start frame and extending forward until a next from-black transition. Likewise, if the C-end frame and the D-start frame have a from-black transition, the contiguous black-frames are those starting with the C-end frame and extending backward until the previous to-black transition.

A third condition is that either a fourth condition or a fifth condition is satisfied. The fourth condition is that the duration is more than a second threshold-black-duration, which in one embodiment is the BD-MinBlackTransDur value. The fifth condition is that there is at least one frame within a threshold-sound-displacement of the contiguous black-frames that has a mute attribute. In one embodiment, the threshold-sound-displacement is a value in a range from zero seconds to one second, and in a more particular embodiment, is approximately one-sixth second. The third condition helps to ensure that a relatively small number of contiguous black-frames do not result in the division of a portion of the video package into two VSs.

All condition sets in this disclosure are provided as examples. In some embodiments, a given condition set may include fewer conditions (e.g., a subset of the conditions provided), or it may include alternate conditions.

The VSs C and D described above are provided as examples illustrating the process involved in step 308-3. In one embodiment, the traversal continues until the start of the video package is reached such that positions of all VSs between the start of the video package and the frame A (where the reverse traversal began) are identified. In one embodiment, a VS table (or other data structure) may store the starting and ending frame indicators and the duration of each VS (which may be determined based on the frame indicators). The VS table may further maintain a count of VSs in the video package, which as discussed below, may be utilized in later steps of the presently disclosed methods. The data represented in the VS table may also be referred to herein as the "tagging data."

C. Identifying a Type of at Least a Portion of the VSs Having Identified Positions Referring back to FIG. 3, in step 310, the frame-processing device 104 identifies a type of at least a portion of the VSs having identified positions. In one embodiment, specific types of VSs are identified using sub-steps 310-1 through 310-11. In discussing some of these sub-steps, reference may be made to a last possible show-segment mark. This mark is determined by subtracting the FSD-DurShowSegVCs from the duration of the video package, and represents the latest possible time in the video package that the first show-segment VC can logically start with all of the show-segment VCs being able to fit in the video package.

The steps involved in identifying various types of VSs will now be described. These steps include (1) identifying a colorbar VS, (2) identifying a slate VS, (3) identifying a first show-segment VC, (4) identifying a remaining show-segment VC, and (5) identifying a barter VC. As VSs are identified as having a particular type throughout this disclosure, it should be noted that those identifications may not initially be accurate. However, based on subsequent analysis, those identifications may be modified (e.g., by splitting or merging VSs) as determined to be appropriate.

1. Identifying a Colorbar VS

Figure 5A:
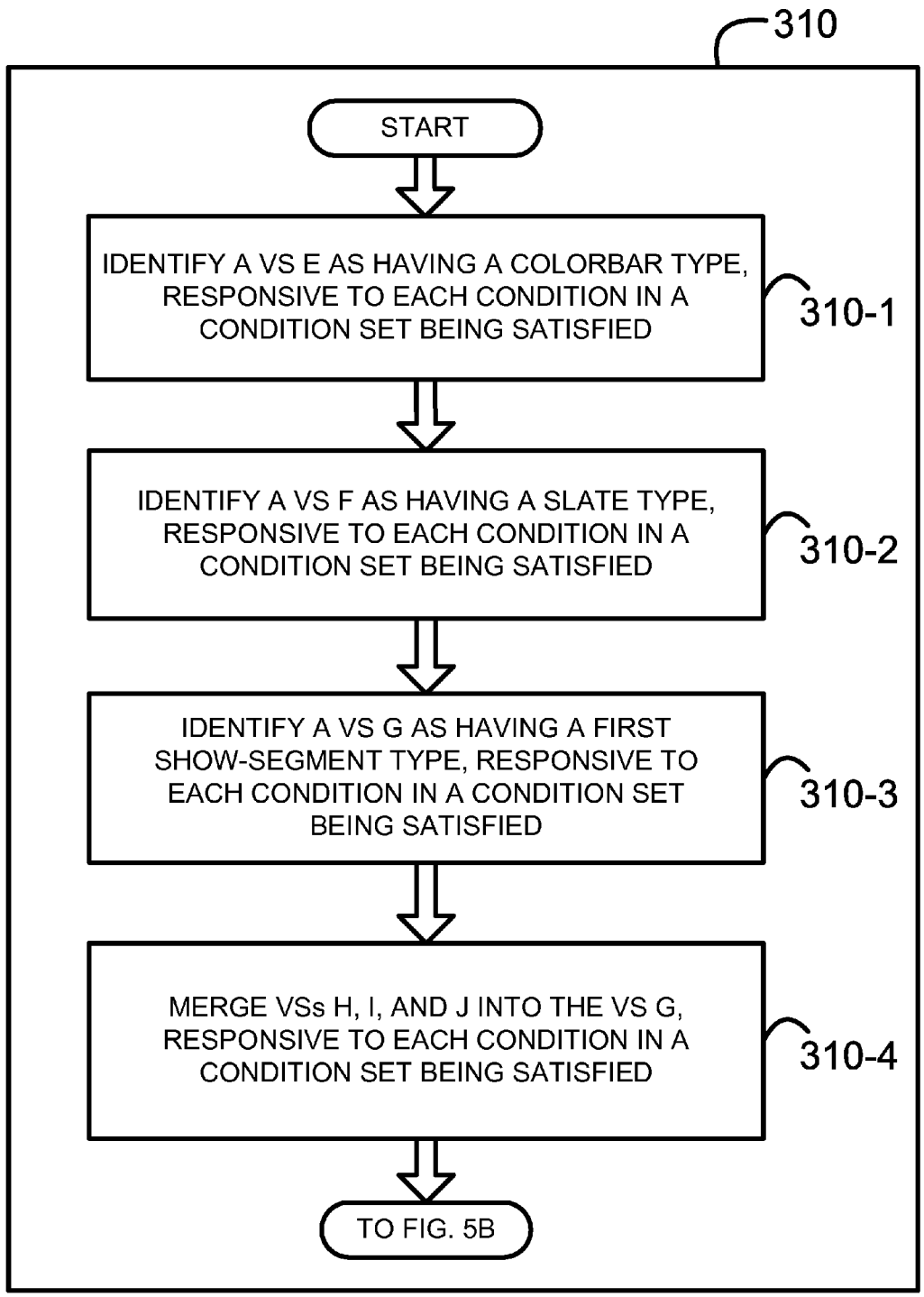
FIG. 5 (5A, 5B, and 5C) is a flow chart illustrating sub-steps of step 310 in FIG. 3
Figure 5B:
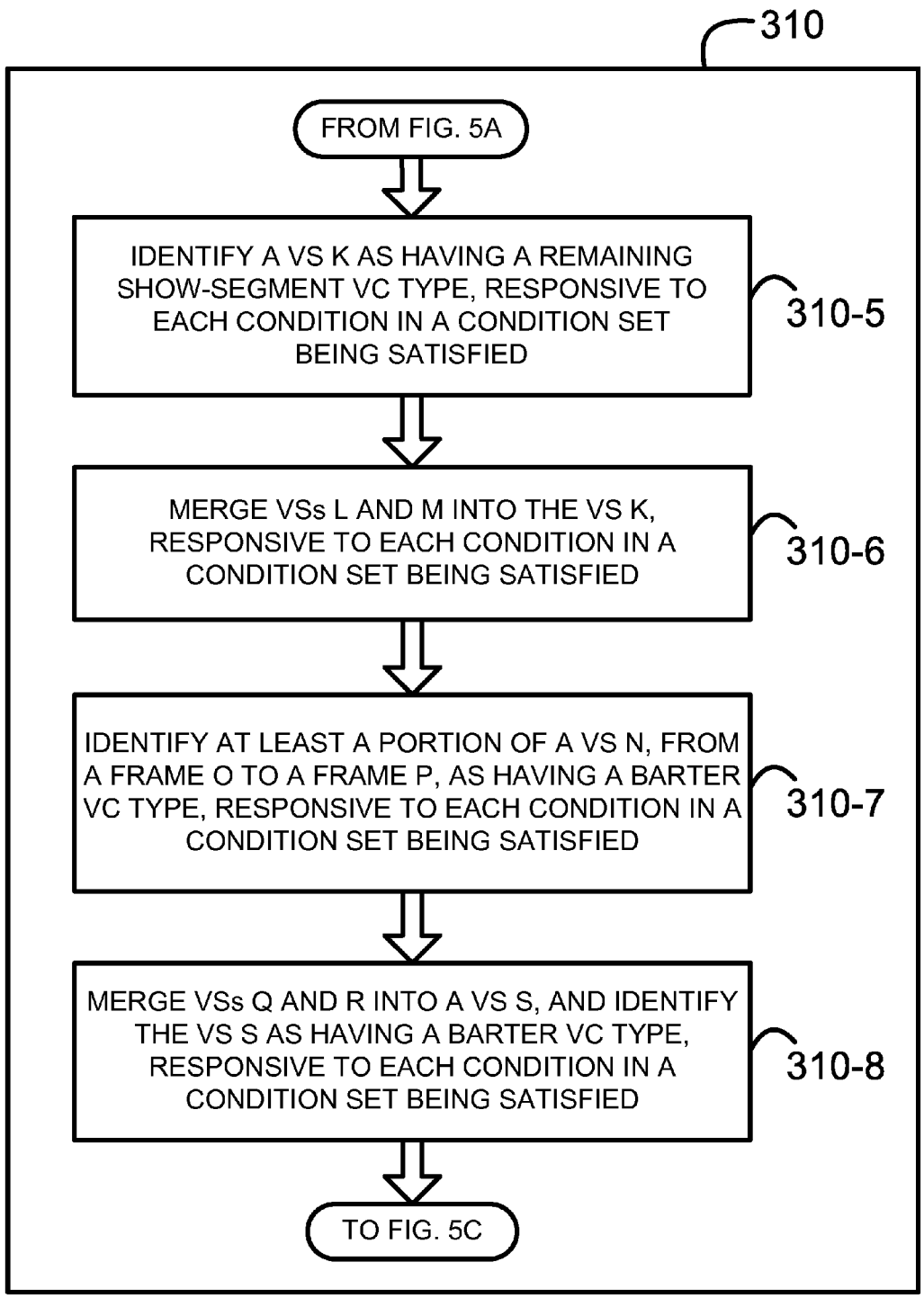
Figure 5C:
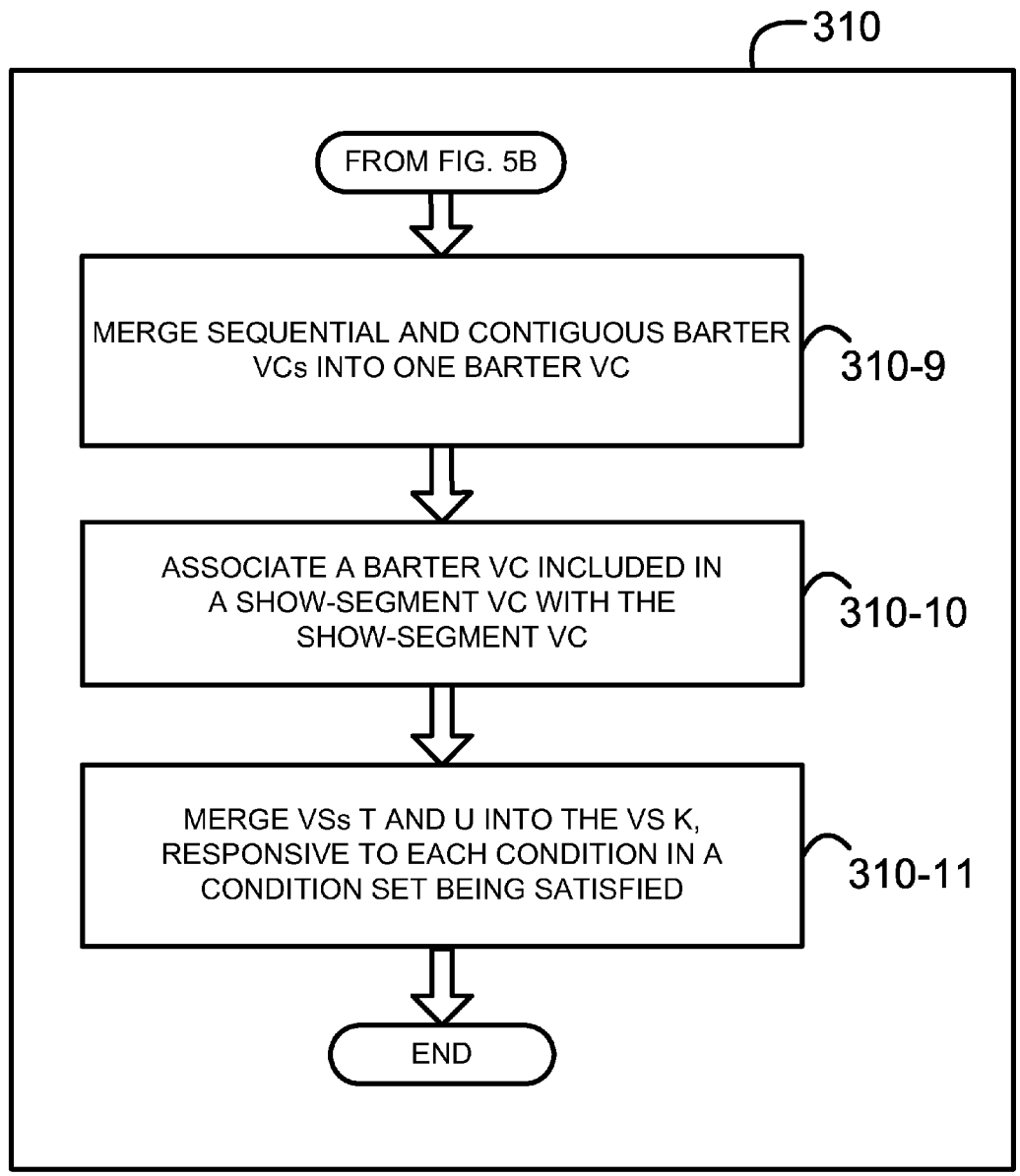

Referring now to FIG. 5, in step 310-1, the frame-processing device 104 identifies a VS E (in the video package) as having a colorbar type, responsive to each condition in a condition set being satisfied. A first condition in the condition set is that a count of VSs in the video package is more than a threshold count, which in one embodiment is a value in a range from five to seven, and in a more particular embodiment, is six. The second condition is that a duration of the VS E is more than a first threshold-duration, which in one embodiment is a value in a range from zero seconds to two seconds, and in a more particular embodiment, is approximately one second. The third condition is that the duration of the VS E minus a combined duration of all frames in the VS E that have a colorbar attribute, is less than or equal to a second threshold-duration, which in one embodiment is a value in a range from zero seconds to two seconds, and in a more particular embodiment, is approximately one second.

Since a colorbar VS is typically the first or one of the first few VSs of a video package, in one embodiment, the frame-processing device 104 may traverse the first three VSs in the video package in chronological order while applying the condition set described above until each condition in the condition set is satisfied.

2. Identifying a Slate VS

In step 310-2, the frame-processing device 104 identifies a VS F as having a slate type, responsive to each condition in a condition set being satisfied. A first condition in the condition set is that an end of the VS F precedes the last possible show-segment mark. A second condition is that the VS F is not one of the last two VSs in the video package (as this would not leave sufficient room for the show-segment VCs). A third condition is that more than a threshold percentage of frames in the VS F have a mute attribute. In one embodiment, the threshold percentage is a value between forty percent and sixty percent, and in a more particular embodiment, is approximately fifty percent. A fourth condition is that more than a threshold percentage of frames in the VS F have a non-black attribute. In one embodiment, the threshold percentage is a value between eighty percent and one-hundred percent, and in a more particular embodiment, is approximately ninety-five percent.

Notably, if the frame-processing device 104 has already identified a colorbar VS in the video package, the condition set may include an additional condition, namely that the VS F is positioned after the colorbar VS. It should be noted that in some instances where a video package includes both a slate VS and a colorbar VS, the slate VS is the next VS after the colorbar VS. Therefore, in one embodiment, VSs in the video package are traversed in chronological order while applying the condition set described above until the condition set is satisfied. Again, the extent of the traversal may also be limited. For example, the frame-processing device 104 may stop the traversal if no slate VS is identified based on a consideration of the first five VSs. In one example, the condition set may include yet another condition, namely that one or more VSs has a threshold duration (as this may indicate an increased likelihood that a slate VS follows a colorbar VS).

3. Identifying a First Show-Segment VC

In step 310-3, the frame-processing device 104 identifies a VS G as having a first show-segment VC type, responsive to each condition in a condition set being satisfied. Notably, one of at least two different conditions sets may be used in this step. If the frame-processing device 104 has identified a colorbar VC and an adjacent slate VC in the video package, then a first condition set is used.

A first condition of the first condition set is that the VS G is the first non-black VS (i.e. having at least one frame with a non-black attribute) in the video package after the slate VS. A second condition is that a duration of the VS G is more than a threshold duration, which in one embodiment, is the BD-MinShowSegVCDur value. A third condition is that the end of the VS G precedes the last possible show-segment mark.

In one example, if the conditions in the first condition set are not satisfied, the first condition set may be modified with the first condition being that that the VS G is the second non-black VS (i.e., having at least one frame with a non-black attribute) in the video package after the slate VS. This may address instances where a video package includes two slate VSs.

Alternative to the first condition set, if the frame-processing device 104 has identified a VS in the video package as having a colorbar type and an adjacent VS has not been identified as having a slate type, then a second condition set is used.

A first condition of the second condition set is that the VS G is the first non-black VS (i.e., having a frame with a non-black attribute) after the colorbar VS. A second condition is that a duration of the VS G is more than a threshold duration, which in one embodiment, is the BD-MinShowSegVCDur value. A third condition is that the end of the VS G precedes the last possible programming mark.

Since the frame-processing device 104 is seeking to identify the first show-segment VC, in one embodiment, VSs in the video package are traversed in chronological order while applying the condition set described above until the condition set is satisfied.

If the frame-processing device 104 cannot identify a VS as a first show-segment VC type based on the condition set identified above, in one embodiment, the frame processing-device 104 may add the video package to a "work queue," signifying that it may be appropriate for a user to manually review the video package and potentially provide and/or modify tagging data for the video package. For example, the frame-processing device 104 may add a video package to the work queue when it determines that it is unable to complete the process of tagging, or when it determines that tagging data may be inaccurate. However, in either case, in some embodiments, the frame-processing device 104 may still provide a "best guess" of tagging data, thereby helping to facilitate the user's manual review.

In some instances, contiguous VSs in a video package may need to be "added" to the front of the VS identified as having a first show-segment VC type. This often results when the actual first show-segment VC includes opening scenes having multiple black-frames, followed by credits, followed again by multiple black-frames, and then followed by the substantive content of the show. In these instances, the initial identification of the first show-segment VC may have effectively truncated the portion of the actual first show-segment VC that preceded the substantive content. However, by performing the steps below, the frame-processing device 104 may appropriately merge one or more VSs into the VS identified as having a first show-segment VC type (i.e., resulting in the starting and/or ending frame indicators of the first show-segment VC being updated accordingly).

In particular, in step 310-4, the frame-processing device 104 may merge the VSs H, I, and J into VS G (i.e., such that the VS G becomes the sequential combination of the VSs H, I, J, and G). The frame-processing device 104 may perform such merging responsive to each condition in a condition set being satisfied. A first condition in the condition set is that the VSs H, I, J, and G are sequential (in the order recited) and contiguous. A second condition is that the VS H has not been identified as any type of VS. A third condition is that each frame in the VS I has a black attribute. A fourth condition is that a duration of the VS I is less than a threshold duration, which in one embodiment is a value in a range from one second to three seconds, and in a more particular embodiment, is approximately two seconds.

Notably, in some embodiments, if such merging is performed using the technique described above, the technique may be repeatedly applied (e.g., to handle repeat instances of credits being surrounded by black frames). In one embodiment, the technique may continue to be repeated until the colorbar VS, the slate VS, or the beginning of the video package is reached.

4. Identifying a Remaining Show-Segment VC

In step 310-5, the frame-processing device 104 identifies a VS K as having a remaining show-segment VC type, responsive to each condition in a condition set being satisfied. A first condition in the condition set is that the VS K is after the first show-segment VC. A second condition is that a duration of the VS K is more than a threshold duration, which in one embodiment is the BD-MinShowSegVCDur value.

Since the video package may contain multiple remaining show-segment VCs, in one embodiment, the frame-processing device 104 traverses VSs in the video package in chronological order starting after the first show-segment VC. During the traversal, the frame-processing device 104 applies the condition set described above to potentially identify one or more remaining show-segment VCs.

In some instances, contiguous VSs of a video package may need to be "added" to the back of a VS identified as having a remaining show-segment VC type. In particular, in step 310-6, the frame-processing device 104 may merge the VSs L and M into the VS K (i.e., such that VS K becomes the sequential combination of the VSs K, L, and M). The frame-processing device 104 may perform such merging responsive to each condition in a condition set being satisfied. A first condition in the condition set is that the VSs K, L, and M are sequential and contiguous. A second condition is that the VS L is less than a threshold duration, which in one embodiment is a value in a range from zero seconds to one second, and in a more particular embodiment, is approximately one-half second. A third condition is that the VS M has not been identified as any type of VS.

5. Identifying a Barter VC

Recall that a show-segment VC may include a barter VC. Since the frame-processing device 104 has identified the first and remaining show-segment VCs, they may now be analyzed to further identify barter VCs included therein. Likewise, unidentified VSs may be analyzed to identify barter VCs.

In step 310-7, the frame-processing device 104 identifies at least a portion of a VS N, from a frame O to a frame P, as having a barter VC type, responsive to each condition in a condition set being satisfied. A first condition in the condition set is that the VS N has been identified as a show-segment VC or has not been identified as having a type. A second condition is that the VS N is after a VS identified as having a first show-segment VC type (e.g., the VS G). A third condition is that a frame previous to the frame O and the frame O have a from-black or a scene-change transition. A fourth condition is that the frame P and a next frame have a to-black or a scene-change transition. A fifth condition is that at least one frame between the frame O and the frame P has a sound attribute. A sixth condition is that a duration between the frame O and the frame P is within a threshold duration of one of the common barter durations. In one embodiment, the threshold duration is a value in a range from zero seconds to one second, and in a more particular embodiment, is approximately one-half second.

In one embodiment, the frame-processing device 104 may traverse all frames in the VS N to potentially identify multiple barter VCs contained therein. As such, when one barter VC is identified, the traversal may begin with the next frame (e.g., after the frame P in the example above), and the process may be repeated. Likewise, the process may be repeated for each VS identified as having a show-segment type or that has not been identified as having a type (as referenced in the first condition above).

In some instances, two VSs that have not been identified as having a type and that are separated by a black VS, may be merged together (with the black VS) and the resulting VS may be identified as having a barter VC type. As such, in step 310-8, the frame-processing device 104 merges the VSs Q and R into a VS S, and identifies the VS S as having a barter VC type, responsive to each condition in a condition set being satisfied. A first condition in the condition set is that the VSs Q, R, and S are sequential and contiguous. A second condition is that the VS Q has not been identified as having a type. A third condition is that each frame in the VS R has a black attribute. A fourth condition is that the VS S has not been identified as having a type. A fifth condition is that a combined duration of the VSs Q, R, and S is within a threshold duration of one of the common barter durations. In one embodiment, the threshold duration is a value in a range from zero seconds to one second, and in a more particular embodiment, is approximately one-half second. Notably, in the event that the VS S follows a show-segment VC, the identification of the show-segment may be modified to include the VS S (e.g., by adjusting the frame indicators).

In step 310-9, sequential and contiguous barter VCs are merged into one barter VC. For example, three sequential and contiguous barters VCs having durations of one minute, thirty seconds, and thirty seconds, respectively, would be combined into a single two-minute barter VC (e.g., by adjusting frame indicators accordingly). In step 310-10, a barter VC included in a show-segment VC is associated with that show-segment VC (e.g., by nesting ending frame indicators). In some embodiments, it may be furthered desired to "shift" one or more black frames from one VS to another such that a duration of the barter VC is exactly one of the common barter durations.

In some instances, once the barter VCs have been identified, one or more contiguous VSs in a video package may again need to be "added" to the front of the VS identified as having a show-segment VC type. This often results when an actual show-segment VC includes several black-frames (e.g., resulting from weather interference during broadcast) that have a sufficient duration to be considered a VS on their own, and which therefore may have caused the frame-processing device 104 to divide the show-segment VC into three VSs. However, by performing the steps below, the frame-processing device 104 may properly merge the VSs into one.

In particular, in step 310-11, the frame-processing device 104 may merge VSs T and U into the remaining show-segment VS K (i.e., such that VS K becomes the sequential combination of VSs T, U, and K). The frame-processing device 104 may perform such merging responsive to at least one (and in one embodiment each) condition in a condition set being satisfied. A first condition in the condition set is that the VSs T, U, and K are sequential and contiguous. A second condition is that the VS T has not been identified as having a type. A third condition is that the VS T has at least one frame having a sound attribute. A fourth condition is that at least one frame in the VS T is non-black. A fifth condition is that each frame in the VS U has a black attribute. A sixth condition is that the VS U is less than a threshold duration, which in one embodiment is a value in a range from zero seconds to two seconds, and in a more particular embodiment, is approximately one second.

D. Testing the Identified Positions and Types of VSs in the Video Package

Referring again to FIG. 3, in step 312, the frame-processing device 104 determines a total duration of the VSs identified as having a show-segment VC type. At step 314, the frame-processing device 104 determines a total count of the VSs identified as having a show-segment VC type.

At step 316, the frame-processing device 104 determines whether each condition in a condition set is satisfied, which provides an indication of whether the identified positions and types of the show-segment VCs (and the included barter VCs) are accurate. A first condition in the condition set is that the determined total duration is within a threshold duration of a predetermined duration. In one embodiment, the threshold duration is a value in a range from three to seven seconds, and in a more particular embodiment, is approximately five seconds. In one embodiment, the predetermined duration is the FSD-DurShowSegVCs value. A second condition is that the determined total count is equal to a predetermined count, which in one embodiment, is the FSD-NumShowSegVCs value.

Responsive to determining that each condition in the condition set is satisfied, the frame-processing device 104 performs steps 318, 320, and 322. Responsive to determining that each condition in the condition set is not satisfied, the frame-processing device 104 performs steps 324, 326, and 328.

E. Identifying Promotion VCs in the Video Package

Once the show-segment VCs in the video package have been accurately identified, the frame-processing device 104 identifies the promotion VCs in the video package. At this stage, there are likely relatively few VSs that have not been identified as having a type. Therefore, one or more of these VSs is likely a promotion VC.

At step 318, the frame-processing device 104 identifies a VS V as having a promotion VC type, responsive to each condition in a condition set being satisfied. A first condition in the condition set is that a VS W, the VS V, and a VS X are sequential and contiguous. A second condition is that the VS W and the VS X each have a duration that is less than a threshold upper-bound duration, and that is more than a threshold lower-bound duration. In one embodiment, the threshold upper-bound duration is a value in a range from one second to three seconds, and in a more particular embodiment, is approximately two seconds. In one embodiment, the threshold lower-bound duration is a value in a range from three seconds to five seconds, and in a more particular embodiment, is approximately four seconds. A third condition is that the each frame in the VS W and the VS X has a black attribute. A fourth condition is that each frame in the VS W and the VS X has a mute attribute. Notably, step 318 may be repeated for additional VSs that have not been identified as having a type such that multiple promotion VCs may be identified.

In one embodiment, like the contiguous barter VCs, contiguous promotion VCs may be merger together. While promotion VCs are not typically aired in sequence, it may be beneficial to group them together for editing purposes (e.g., to send to an editor as a group of related promotion VCs.).

F. Associating Tagging Data with the Video Package

In step 320, the frame-processing device 104 associates tagging data with the video package. The tagging data may indicate the identified position and the identified type of at least one (and in one embodiment each) VS in the video package. As such, tagging data for the video package may indicate the identified position and the identified type of the identified show-segments VCs, barter VCs, and promotion VCs included in the video package. In one example, the tagging data may further indicate a barter VC's association with a particular show-segment VC. Further, the tagging data may indicate a sequence number for each VC in a group of VCs having the same type (e.g., a "first" show-segment VC, a "second" show-segment VC, etc.).

In one example, the tagging data may be associated with a particular video package by storing the tagging data, together with a reference to the received video package (e.g., in the computer-readable medium 112). In one example, the stored tagging data may be displayed to a user (e.g., on a display device via a GUI) and/or stored for later retrieval. In one example, the GUI may further provide a user with the ability to modify the tagging data.

G. Generating a House Number Based on the Tagging Data

In step 322, the frame-processing device 104 generates a house number for at least one (and in one embodiment each) VC in the video package based on the tagging data. In one example, the generated house number represents at least a portion of the tagging data. Broadcasting systems typically use a house number to retrieve and broadcast a VC for a given log entry in a log of a scheduling and sequencing system. By generating a house number based on the tagging data, in one example the VCs identified in the video package may be retrieved and broadcast by the broadcasting system without any user interaction. For example, for a video package associated with a show ABC that is scheduled to air on March 1 (03/01), the frame-processing device 104 may generate a house number "ABC0301-S1" for the identified first show-segment VC, and "ABC0301-S2" for the identified second show-segment VC. As another example, for the same video package, the frame-processing device 104 may generate a house number "ABC0301-B1" for the identified first barter VC. As with the tagging data, the generated house number may also be stored in a memory, such as the computer-readable medium 112 for later retrieval.

H. Adding the Video Package to a Work Queue

Recall that responsive to determining that each condition in the condition set is not satisfied, the frame-processing device performs the steps 324, 326, and 328. As discussed above, a video package is added to the work queue when it may be appropriate for a user to manually review the video package and potentially modify the tagging data for the video package. However, to assist the user with such review, in one example, the frame-processing device applies modified techniques to those discussed above to provide a "best guess" as to the identification of the VCs in the video package.

As such, in step 324, the frame-processing device 104 applies one or more best guess techniques to determine best guess tagging data. For example, some VSs may not have been identified as having a show-segment VC type because their duration was too short. As such, the threshold duration applied in the condition sets in steps 310-3 and 310-5 may be repeatedly lowered until the desired total duration and total count of show-segment VCs (as referenced in step 316) are reached.

In another example, if the first condition in step 316 is satisfied, but the second condition is not satisfied (i.e., the total duration of show-segment VCs is acceptable, but the total count of show-segment VCs is not acceptable), the frame-processing device 104 may iteratively merge show-segment VCs separated by a relatively short (e.g., one second) black VS, and repeat the condition testing in step 316, again until the desired count is reached. It may also be the case that the last show-segment VC has not been identified. As such, the frame-processing device 104 may identify all video following the frame previously considered to be the last frame of potential interest (as discussed in step 308-1), as the last show-segment VC. The best guess tagging data may then be provided to a user for review and/or modification, such as via a GUI.

In the step 324, the frame-processing device 104 associates the best guess tagging data with the video package (as described above). In step 326, the frame-processing device 104 adds the received video package to a work queue. As such, a user may monitor the work queue and manually review and/or modify best guess tagging data for one or more video packages. In one example, an alert (e.g., via email) may be provided to a user when a video package is added to the work queue.

VII. Example Advantages

While traditional video editing and analysis techniques may be used to segment video, such techniques rely solely on technical characteristics of the video itself and only identify instances of discontinuity. Such traditional techniques do not consider FSD and/or any other data that may be used, together with frame attributes and/or transitions to identify particular types of VSs. Therefore, traditional techniques are not capable of identifying show-segments, barter, and promotion VCs by position and type as provided in the present disclosure.

As such, one example advantage of the presently disclosed systems and methods is the ability to efficiently and accurately tag a VC in a video package. As described above, tagging all of the VCs in a typical video package associated with a show intended for a thirty-minute time-slot, typically takes between ten to fifteen minutes when using traditional methods. However, when using the disclosed techniques, the same video package may be tagged in two to three minutes or even less. Further, the disclosure techniques provide highly accurate results.

Another example advantage of the presently disclosed systems and methods is the ability to tag a VC in a video package while reducing or eliminating user interaction. As noted above, in some instances, VCs may be tagged and broadcast without any user interaction. Further, even in the event that user interaction may be needed, such as after a video package is added to the work queue, user interaction may still be reduced as compared to the traditional tagging process (e.g., due to the best guess tagging data that is provided to the user).

Another example advantage of the presently disclosed systems and methods is the ability to reduce or eliminate undesired black frames at the beginning and/or end of a VC in a video package, thereby creating an opportunity to broadcast additional video in a given time-slot. Due to the manner in which the video package is divided into VSs (i.e., based on frame transitions), the positions of VCs included within the video package are identified with great accuracy such that "extra" frames (e.g., black frames) are not included in the identified VCs.

As a result, VCs are often several frames shorter in duration as compared to those identified as a result of a user's manual selection of starting and ending frames (i.e., when using traditional tagging methods). This may increase the amount of local black in a time-slot and therefore allow for one or more additional VCs (e.g., a five second promotion) to be broadcast during a time-slot that was previously considered to be full. This is particularly beneficial to a broadcasting company as a substantial portion of their revenue results from selling broadcast time-slots. In one example, the frame-processing device 104 may provide the total duration of VCs for a given time slot such that a user may modify a corresponding log to include one or more additional VCs to fill the time-slot that was previously considered to be full.

VIII. Example Variations

As discussed above, each video package includes at least one show-segment VC, and the disclosed techniques may often be used in connection with a video package that includes one or more show-segments associated with a show intended to air during a particular time-slot. However, in an alternative embodiment, the disclosed techniques may be used in connection with a video collection. A video collection is identical to a video package, except that the video collection does not include at least one show-segment, but rather includes at least one video portion (VP). A VP may include any type of video. For example, a VP may be a thirty-second commercial. In this alternative embodiment, the disclosed techniques may be applied in the same manner to a video collection including one or more VPs (with each disclosed reference to a video package being changed to refer to a video collection, and each disclosed reference to a show-segment VC being changed to refer to a VP). In such an example where the VP is a thirty-second commercial, the FSD-NumShowSegVCs may be one, and the FSD-DurShowSegVCs may be thirty seconds, such that the disclosed technique will allow the commercial in the video collection to be appropriately tagged.

Throughout this disclosure, in some instances, steps may be defined by activity of the user. In these instances, such described steps should also be interpreted as describing the computer-readable medium and/or system components as containing instructions that, when executed, take appropriate steps or provide appropriate output requesting the user to perform such steps and/or instructions for receiving the user's input and proceeding accordingly.

Although the present invention has been described in terms of certain embodiments and generally associated methods, alterations and permutations of these embodiments and methods will be apparent to those skilled in the art. Accordingly, the above description of example embodiments does not define or constrain the present invention.

In particular, it is noted that while some specific embodiments have been described using particular algorithmic language, the present invention should not be construed as being limited to those particular techniques. For example, descriptions that include recursive techniques can be implemented using iterative techniques and vice-versa. Further, serial and parallel implementations can be interchanged. Similarly, it is contemplated that the use of certain logical structures including loops and condition statements can be modified, interchanged, or restricted without departing from the present invention. Other changes, substitutions, and alterations are also possible without departing from the invention in its broader aspects as set forth in the following claims.

The invention claimed is:

1. A method comprising:
   receiving, by a frame-processing device, a video package;
   identifying, by a starting frame indicator and an ending frame indicator, a position of each of multiple video sections (VS) in the received video package based on frame-pair transitions in the received video package;
   identifying a type of at least a portion of the VSs having identified positions, wherein at least one VS is identified as having a show-segment video component (VC) type;
   determining a total duration of the VSs identified as having a show-segment VC type;
   determining a total count of the VSs identified as having a show-segment VC type;
   determining whether each condition in a condition set is satisfied, the condition set comprising the determined total duration is within a threshold range of a predetermined duration; and
   responsive to determining that each condition in the condition set is satisfied, associating tagging data with the received video package, wherein the tagging data indicates the position and type of each VS identified as having a show-segment VC type;
   wherein identifying, by the starting frame indicator and the ending frame indicator, the position of each of the multiple VSs in the received video package comprises:
   identifying a last to-mute transition in the video package, wherein the to-mute transition identifies a transition from a frame A having a sound attribute to an adjacent frame B having a mute attribute;
   traversing frames of the video package in reverse chronological order starting with the frame A; and
   during the traversal, identifying a frame C-end as an end of a VS C and an adjacent frame D-start as a start of a VS D, responsive to each condition in a condition set being satisfied, the condition set comprising: (i) the C-end frame and the D-start frame have either a from-black or a to-black transition, (ii) a duration of contiguous black-frames starting at the transition is more than a first threshold-black-duration, and (iii) either (a) the duration is less than a second threshold-black-duration or (b) there is at least one frame within a threshold-sound-displacement of the contiguous black-frames that has a mute attribute.

2. The method of claim 1, wherein the first threshold-black-duration is a value in a range from zero seconds to one second.

3. The method of claim 1, wherein identifying a position of each of the multiple VSs comprises identifying a position of a VS A and a VS B, and wherein identifying the type of the at least a portion of the VSs having identified positions comprises:
  identifying the VS A as having a colorbar type; and
  identifying the VS B as having a first show-segment VC type, responsive to each condition in a condition set being satisfied, the set comprising (i) the VS B is a first non-black VS in the video package after the VS A, and (ii) a duration of the VS B is more than a threshold duration.

4. The method of claim 3, wherein the threshold duration is a value in a range from three minutes to five minutes.

5. The method of claim 1, wherein identifying a position of each of the multiple VSs comprises identifying a position of a VS A, a VS B, and a VS C, and wherein identifying the type of the at least a portion of the VSs having identified positions comprises:
  identifying the VS A as having a colorbar type;
  identifying the VS B as having a slate type, wherein the VS B is adjacent to the VS A; and
  identifying the VS C as having a first show-segment VC type, responsive to each condition in a condition set being satisfied, the set comprising (i) the VS C is a first non-black VS in the video package after the VS B, and (ii) a duration of the VS C is more than a threshold duration.

6. The method of claim 5, wherein the threshold duration is a value in a range from three minutes to five minutes.

7. The method of claim 5, wherein identifying the VS A as having a colorbar type comprises:
  identifying the VS A as having a colorbar type, responsive to each condition in a condition set being satisfied, the set comprising (i) a count of the VSs in the video package is more than a threshold count, (ii) a duration of the VS A is more than a first threshold-duration, and (iii) the duration of the VS A minus a combined duration of all frames in the VS A that have a colorbar attribute, is less than or equal to a second threshold-duration.

8. The method of claim 7, wherein the threshold count in a value in a range from five to seven, the first threshold-duration is a value in a range from zero seconds to two seconds, and the second threshold-duration is a value in a range from zero seconds to two seconds.

9. The method of claim 5, wherein identifying the VS B as having a slate type comprises:
  identifying the VS B as having a slate type, responsive to each condition in a condition set being satisfied, the set comprising (i) more than a first threshold-percentage of frames in the VS B have a mute attribute, and (ii) more than a second threshold-percentage of frames in the VS B have a non-black attribute.

10. The method of claim 9, wherein the first threshold-percentage is a value in a range from forty percent to sixty percent, and the second threshold-percentage is a value in a range from eighty percent to one-hundred percent.

11. The method of claim 5, wherein identifying a position of each of the multiple VSs comprises identifying a position of a VS D, a VS E, and a VS F, and wherein identifying the type of the at least a portion of the VSs having identified positions comprises:
  merging the VSs D, E, and F into the VC C, responsive to at least one condition in a condition set being satisfied, the set comprising (i) the VSs D, E, F, and C are sequential and contiguous, (ii) the VS D has not been identified as any type of VS, (iii) each frame in the VS D has a black attribute, and (iv) a duration of the VS E is less than a threshold duration.

12. The method of claim 11, wherein the threshold duration is a value in a range from one second to three seconds.

13. The method of claim 5, wherein identifying a position of each of the multiple VSs comprises identifying a position of a VS D, and wherein identifying the type of the at least a portion of the VSs having identified positions comprises:
  identifying the VS D as having a remaining show-segment VC type, responsive to each condition in a condition set being satisfied, the set comprising (i) the VS D is after the VS C, and (ii) a duration of the VS D is more than a threshold duration.

14. The method of claim 13, wherein the threshold duration is a value in a range from three minutes to five minutes.

15. The method of claim 5, wherein identifying a position of each of the multiple VSs comprises identifying a position of a VS D and a VS E, and wherein identifying the type of the at least a portion of the VSs having identified positions comprises:
  merging the VSs D and E into the VS C, responsive to at least one condition in a condition set being satisfied, the set comprising (i) the VSs C, D, and E are sequential and contiguous, (ii) the VS D is less than a threshold duration, and (iii) the VS E has not been identified as any type of VS.

16. The method of claim 15, wherein the threshold duration is a value in a range from zero seconds to one second.

17. The method of claim 1, wherein identifying a position of each of the multiple VSs comprises identifying a position of a VS A, and wherein identifying the type of the at least a portion of the VSs having identified positions comprises:
  identifying at least a portion of the VS A, from a frame B to a frame C, as having a barter VC type, responsive to each condition in a condition set being satisfied, the set comprising: (i) the VS A has been identified as a show-segment or has not been identified as having a type of VS, (ii) the VS A is after a VS identified as having a first show-segment VC type, (iii) a frame previous to the frame B and the frame B have a from-black or a scene-change transition, (iv) the frame C and a next frame have a to-black or a scene-change transition, (v) at least one frame between the frame B and the frame C has a sound attribute, and (vi) a duration between the frame B and the frame C is within a threshold duration.

18. The method of claim 17, wherein the threshold duration is a value in a range from zero seconds to one second.

19. The method of claim 1, wherein identifying a position of each of the multiple VSs comprises identifying a position of a VS A, a VS B, and a VS C, and wherein identifying the type of the at least a portion of the VSs having identified positions comprises:
  identifying the VS B as having a promotion VC type, responsive to each condition in a condition set being satisfied, the set comprising (i) the VS A, the VS B, and the VS C are sequential and contiguous, (ii) the VS A and the VS C each have a duration that is less than a threshold upper-bound duration, and that is more than a threshold lower-bound duration, (iii) each frame in the VS A and the VS C has a black attribute, and (iv) each frame in the VS A and the VS C has a mute attribute.

20. The method of claim 19, wherein the threshold upper-bound duration is a value in a range from one second to three seconds, and the threshold lower-bound duration is a value in a range from three seconds to five seconds.

21. The method of claim 1, wherein the condition set further comprises the determined total count is equal to a predetermined count.

22. The method of claim 1, further comprising generating a house number based on the associated tagging data, wherein at least a portion of the tagging data is represented in the house number.

23. The method of claim 1, further comprising responsive to determining that each condition in the condition set is not satisfied, adding the received video package to a work queue.

24. The method of claim 1, wherein associating tagging data with the video package comprises storing the associated tagging data, together with a reference to the received video package, in a computer-readable medium.

25. The method of claim 1, further comprising:
generating a frame-attribute table that represents select frame attributes of multiple frames in the received video package; and
generating a frame-pair transition table that represents select transitions for multiple pairs of adjacent frames in the received video package,
wherein identifying the position of each of the multiple VS uses the generated frame-attribute table and the generated frame-pair transition table.

26. A computer-readable medium containing instructions that, when executed by a processor, cause a set of steps to be carried out by a frame-processing device, the set comprising:
receiving a video package;
identifying, by a starting frame indicator and an ending frame indicator, a position of each of multiple video sections (VS) in the received video package based on frame-pair transitions in the received video package;
identifying a type of at least a portion of the VSs having identified positions, wherein at least one VS is identified as having a show-segment video component (VC) type;
determining a total duration of the VSs identified as having a show-segment VC type;
determining a total count of the VSs identified as having a show-segment VC type;
determining whether each condition in a condition set is satisfied, the condition set comprising the determined total duration is within a threshold range of a predetermined duration; and
responsive to determining that each condition in the condition set is satisfied, associating tagging data with the received video package, wherein the tagging data indicates the position and type of each VS identified as having a show-segment VC type;
wherein identifying, by the starting frame indicator and the ending frame indicator, the position of each of the multiple VSs in the received video package comprises:
identifying a last to-mute transition in the video package, wherein the to-mute transition identifies a transition from a frame A having a sound attribute to an adjacent frame B having a mute attribute;
traversing frames of the video package in reverse chronological order starting with the frame A; and
during the traversal, identifying a frame C-end as an end of a VS C and an adjacent frame D-start as a start of a VS D, responsive to each condition in a condition set being satisfied, the condition set comprising: (i) the C-end frame and the D-start frame have either a from-black or a to-black transition, (ii) a duration of contiguous black-frames starting at the transition is more than a first threshold-black-duration, and (iii) either (a) the duration is less than a second threshold-black-duration or (b) there is at least one frame within a threshold-sound-displacement of the contiguous black-frames that has a mute attribute.

27. The computer-readable medium of claim 26, wherein identifying a position of each of the multiple VSs comprises identifying a position of a VS A and a VS B, and wherein identifying the type of the at least a portion of the VSs having identified positions comprises:
identifying the VS A as having a colorbar type; and
identifying the VS B as having a first show-segment VC type, responsive to each condition in a condition set being satisfied, the set comprising (i) the VS B is a first non-black VS in the video package after the VS A, and (ii) a duration of the VS B is more than a threshold duration.

28. A frame-processing device comprising:
a processor; and
computer-readable medium containing instructions that, when executed by the processor, cause a set of steps to be carried out by the frame-processing device, the set comprising:
receiving a video package;
identifying, by a starting frame indicator and an ending frame indicator, a position of each of multiple video sections (VS) in the received video package based on frame-pair transitions in the received video package;
identifying a type of at least a portion of the VSs having identified positions, wherein at least one VS is identified as having a show-segment video component (VC) type;
determining a total duration of the VSs identified as having a show-segment VC type;
determining a total count of the VSs identified as having a show-segment VC type;
determining whether each condition in a condition set is satisfied, the condition set comprising the determined total duration is within a threshold range of a predetermined duration; and
responsive to determining that each condition in the condition set is satisfied, associating tagging data with the received video package, wherein the tagging data indicates the position and type of each VS identified as having a show-segment VC type;
wherein identifying, by the starting frame indicator and the ending frame indicator, the position of each of the multiple VSs in the received video package comprises:
identifying a last to-mute transition in the video package, wherein the to-mute transition identifies a transition from a frame A having a sound attribute to an adjacent frame B having a mute attribute;
traversing frames of the video package in reverse chronological order starting with the frame A; and
during the traversal, identifying a frame C-end as an end of a VS C and an adjacent frame D-start as a start of a VS D, responsive to each condition in a condition set being satisfied, the condition set comprising: (i) the C-end frame and the D-start frame have either a from-black or a to-black transition, (ii) a duration of contiguous black-frames starting at the transition is more than a first threshold-black-duration, and (iii) either (a) the duration is less than a second threshold-black-duration or (b) there is at least one frame within a threshold-sound-displacement of the contiguous black-frames that has a mute attribute.

* * * * *